United States Patent
Atsumi

(10) Patent No.: US 7,855,580 B2
(45) Date of Patent: Dec. 21, 2010

(54) PHASE COMPARATOR, PHASE SYNCHRONIZING CIRCUIT, AND PHASE-COMPARISON CONTROL METHOD

(75) Inventor: Ken Atsumi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/341,032

(22) Filed: Dec. 22, 2008

(65) Prior Publication Data

US 2009/0273371 A1    Nov. 5, 2009

(30) Foreign Application Priority Data

May 1, 2008   (JP)  ............... 2008-119905

(51) Int. Cl.
    *G01R 25/00*   (2006.01)
    *H03D 13/00*   (2006.01)

(52) U.S. Cl. ............ 327/5; 327/3; 327/7; 327/12; 327/18; 327/20; 327/156; 331/25

(58) Field of Classification Search ............ 327/2, 327/3, 5, 7–10, 12, 18, 20, 21, 147, 156, 327/163; 331/14, 17, 18, 25, 1 A
See application file for complete search history.

(56) References Cited

U.S. PATENT DOCUMENTS 5,410,572 A * 4/1995 Yoshida ............... 375/376
6,342,818 B1 * 1/2002 Segawa et al. ............ 331/14
6,791,421 B2 * 9/2004 Oita ..................... 331/14
7,038,508 B2 * 5/2006 Parker et al. ............ 327/156

FOREIGN PATENT DOCUMENTS

| JP | 5-68132 | | 9/1993 |
|---|---|---|---|
| JP | 09064731 A | * | 3/1997 |
| JP | 2000-349625 | | 12/2000 |
| JP | 2002-152042 | | 5/2002 |
| JP | 2006-253869 | | 9/2006 |

* cited by examiner

*Primary Examiner*—Lincoln Donovan
*Assistant Examiner*—Patrick O'Neill
(74) *Attorney, Agent, or Firm*—Katten Muchin Rosenman LLP

(57) ABSTRACT

A phase comparator includes an edge detecting unit to which a reference signal is input and to which a referred signal based on the reference signal is input as a feedback signal. The edge detecting unit detects an edge of the reference signal and an edge of the referred signal. The phase comparator also includes a phase-difference detecting unit that detects a phase difference between the edge of the reference signal and the edge of the referred signal. The phase comparator also includes a phase-difference-signal output unit that outputs a phase-difference signal for current control based on the phase difference. The phase comparator also includes an input-break detecting unit that detects an input break of the reference signal when an edge of the referred signal is again detected after an edge of the referred signal is detected and before an edge of the reference signal is detected.

15 Claims, 8 Drawing Sheets

PHASE COMPARATOR, PHASE SYNCHRONIZING CIRCUIT, AND PHASE-COMPARISON CONTROL METHOD

CROSS-REFERENCE TO RELATED APPLICATION

This application is based upon and claims the benefit of priority from the prior Japanese Patent Application No. 2008-119905 filed on May 1, 2008, the entire contents of which are incorporated herein by reference.

BACKGROUND

1. Field

The present invention relates to a phase comparator, phase synchronizing circuit, and phase-comparison control method of detecting a phase difference between a reference signal, such as a reference frequency signal, and a referred signal having a desired frequency based on the reference signal.

2. Description of the Related Art

Conventionally, in a phase synchronizing circuit, such as a phase-locked loop (PLL) circuit for use in a wired transmission apparatus, wireless transmission apparatus, general consumer product, and others, for example, a reference signal, such as a reference-frequency signal, is input, thereby generating an output signal that synchronizes with this reference signal and has a desired frequency.

FIG. 6 is a block diagram of a schematic configuration of the inside of a PLL circuit in a conventional technology.

A PLL circuit 100 depicted in FIG. 6 includes a 1/R frequency divider 101 that performs R-frequency-division on a reference signal, a 1/N frequency divider 102 that performs N-frequency-division on a referred signal, which is an output signal of the PLL circuit 100, which will be explained further below, a phase comparator 103 that outputs, based on a phase difference between an R-frequency-divided reference signal φr and an N-frequency-divided referred signal φn, a phase-difference signal for current control so as to decrease the phase difference, a loop filter 104 that outputs a control voltage according to the phase-difference signal, and a voltage control oscillator (VCO) 105 that generates and outputs a referred signal having a desired frequency.

The PLL circuit 100 outputs a referred signal synchronizing with the reference signal according to the phase-difference signal and having a desired frequency.

The phase comparator 103 is assumed to adopt a constant-current charge-pump output phase comparator. Here, the constant-current charge-pump output phase comparator is easy to design compared with a conventional constant-voltage charge-pump output phase comparator due to no dead zone at a locking point where the reference signal φr and the referred signal φn match each other in phase and less errors between simulation and actual measurement values, and also has a small phase noise level and allows operation at high speed.

FIG. 7 is a circuit diagram of a schematic configuration of the inside of the phase comparator 103 according to the conventional technology.

The phase comparator 103 depicted in FIG. 7 includes a phase-difference detecting unit 111 that detects a phase difference between the reference signal φr and the referred signal φn, and a constant-current output unit 112 that produces a charge-pump output of a phase difference signal for current control based on the detection result of the phase-difference detecting unit 111.

The phase-difference detecting unit 111 includes a latch-type flip-flop circuit (hereinafter, simply "D-FF") for reference signal 111A that detects a rising edge of the reference signal φr, a D-FF 111B for referred signal that detects a rising edge of the referred signal φn, an NAND circuit 111C that resets the D-FF 111A for reference signal and the D-FF 111B for referred signal, and a NOT circuit The constant-current output unit 112 includes a Complementary Metal Oxide Semiconductor (C-MOS) formed of a P-type field-effect transistor (FET) 112A and an N-type FET 112B, a positive-direction current source 112C, and a negative-direction current source 112D.

For example, as depicted in FIG. 8, when the referred signal φn lags behind the reference signal φr in phase (refer to a timing T1), upon a clock input of a rising edge of the reference signal φr, the D-FF 111A for reference signal inputs a high level (hereinafter, simply "H level") to the NOT circuit 111D and the NAND circuit 111C.

The NOT circuit 111D inputs to the P-type FET 112A a low level (hereinafter, simply "L level") according to the H level from the D-FF 111A for reference signal.

The P-type FET 112A brings the source and drain into conduction according to a gate input at an L level, and outputs to the loop filter 104 a phase-difference signal for current discharge from the positive-direction current source 112C.

As a result, when the referred signal φn lags behind the reference signal φr in phase, the phase comparator 103 causes the constant-current output unit 112 to perform a constant-current discharging operation (constant-current output operation) to discharge a current from the positive-direction current source 112C. With this, a control voltage, which is an output from the loop filter 104, is increased. According to the increase in control voltage, the output phase of the referred signal generated and output from the VCO 105 leads.

Furthermore, upon a clock input of a rising edge of the referred signal φn (refer to a timing T2), the D-FF 111B for referred signal inputs an H level to the NAND circuit 111C and the N-type FET 112B.

The NAND circuit 111C produces an inverted input of an L level according to the H level from the D-FF 111A for reference signal and the H level from the D-FF 111B for referred signal to clear (CLR) inputs of the D-FF 111A for reference signal and the D-FF 111B for referred signal.

The D-FF 111A for reference signal and the D-FF 111B for referred signal each produce a clear input of an H level, thereby resetting its output state. As a result, the P-type FET 112A and the N-type FET 112B become in a high-impedance state in which the source and drain are not conducting. Then, the P-type FET 112A causes the constant-current output unit 112 to stop the constant-current discharging operation (constant-current output operation) to discharge a current from the positive-direction current source 112C (refer to an output at the timing T2).

Also, as depicted in FIG. 8, when the referred signal φn leads the reference signal φr in phase (refer to a timing T3), the D-FF 111B for referred signal produces a clock input of a rising edge of the referred signal φn, and inputs an H level to the NAND circuit 111C and the N-type FET 112B.

The N-type FET 112B brings the source and drain into conduction according to a gate input at an H level, and outputs to the loop filter 104 a phase-difference signal for current intake into the negative-direction current source 112D.

As a result, when the referred signal φn leads the reference signal φr in phase, the phase comparator 103 causes the constant-current output unit 112 to perform a constant-current intake operation (constant-current output operation) to take a current into the negative-direction current source 112D. With this, the control voltage, which is an output from the loop filter 104, is decreased. According to the decrease in control voltage, the output phase of the referred signal generated and output from the VCO 105 lags.

Furthermore, upon a clock input of a rising edge of the reference signal φr (refer to a timing T4), the 111A for reference signal inputs an H level to the NAND circuit 111C.

The NAND circuit 111C produces an inverted input of an L level according to the H level from the D-FF 111B for referred signal and the H level from D-FF 111A for reference signal to clear inputs of the D-FF 111A for reference signal and the D-FF 111B for referred signal.

The D-FF 111A for reference signal and the D-FF 111B for referred signal each produce a clear input of an H level, thereby resetting its output state. As a result, the P-type FET 112A and the N-type FET 112B become in a high-impedance state in which the source and drain are not conducting. Then, the N-type FET 112B causes the constant-current output unit 112 to stop the constant-current intake operation (constant-current output operation) to take a current into the negative-direction current source 112D (refer to a timing T4).

With the phase comparator 103 repeating the constant-current output operations including the constant-current discharging operation with ON driving of the P-type FET 112A and the constant-current intake operation with ON driving of the N-type FET 112B, a phase difference between the reference signal φr and the referred signal φn is eliminated.

However, according to the conventional phase comparator 103, as depicted in FIG. 9, when an input break occurs in the reference signal φr, the D-FF 111B for referred signal produces a gate input at an H level to the N-type FET 112B according to a rising edge of the referred signal φn, continuing a constant-current intake operation to the negative-direction current source 112D until a rising edge of the reference signal φr is detected. For this reason, according to a decrease in control voltage to the VCO 105, a VCO output frequency is significantly shifted from the center value. This may disadvantageously cause an output frequency (control voltage) to stick to a lower limit.

To address this situation, PLL-circuit technologies have been known in which the PLL circuit includes an input-break detection circuit that detects an input break of a reference signal and a circuit that produces a switch-output of a VCO control voltage upon detection of an input break of the reference signal (refer to Japanese Utility-Model Application Laid-open No. 5-68132, Japanese Patent Application Laid-open No. 2002-152042, and Japanese Patent Application Laid-open No. 2006-253869).

However, according to the PLL circuit in the conventional technologies mentioned above, the input-break detection circuit that detects an input break of the reference signal is disposed outside of the phase comparator. This, as a matter of course, increases the circuitry size, and may also increase cost according to an increase in the number of components.

SUMMARY

It is an object of the present invention to at least partially solve the problems in the conventional technology.

According to an aspect of the present invention, a phase comparator includes an edge detecting unit to which a reference signal is input and to which a referred signal based on the reference signal is input as a feedback signal, the edge detecting unit detecting an edge of the reference signal and an edge of the referred signal. The phase comparator also includes a phase-difference detecting unit that detects a phase difference between the edge of the reference signal and the edge of the referred signal detected by the edge detecting unit, and a phase-difference-signal output unit that outputs a phase-difference signal for current control based on the phase difference detected by the phase-difference detecting unit so that the phase difference between the reference signal and the referred signal is decreased. The phase comparator also includes an input-break detecting unit that detects an input break of the reference signal when an edge of the referred signal is again detected after an edge of the referred signal is detected and before an edge of the reference signal is detected.

According to another aspect of the present invention, a phase synchronizing circuit includes a phase comparing unit to which a reference signal is input and to which a referred signal based on the reference signal is input as a feedback signal, the phase comparing unit outputting a phase-difference signal for current control based on a phase difference between the input reference signal and the referred signal so that the phase difference between the reference signal and the referred signal is decreased. The phase synchronizing circuit also includes a control-voltage generating unit that outputs a control voltage according to the phase-difference signal from the phase comparing unit, and a voltage-control oscillating unit that generates and outputs a referred signal having a desired frequency according to the control voltage generated by the control-voltage generating unit. The phase comparing unit includes an edge detecting unit that detects an edge of the reference signal and an edge of the referred signal; a phase-difference detecting unit that detects a phase difference between the edge of the reference signal and the edge of the referred signal detected by the edge detecting unit; a phase-difference-signal output unit that outputs a phase-difference signal for current control based on the phase difference detected by the phase-difference detecting unit so that the phase difference between the reference signal and the referred signal is decreased; and an input-break detecting unit that detects an input break of the reference signal when an edge of the referred signal is again detected after an edge of the referred signal is detected and before an edge of the reference signal is detected.

According to still another aspect of the present invention, a phase-comparison control method includes detecting an edge of an input reference signal and an edge of a referred signal input as a feedback signal based on the reference signal; detecting a phase difference between the detected edge of the reference signal and the detected edge of the referred signal; outputting a phase-difference signal for current control based on the detected phase difference so that the phase difference between the reference signal and the referred signal is decreased; and detecting an input break of the reference signal when an edge of the referred signal is again detected after an edge of the referred signal is detected and before an edge of the reference signal is detected.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DETAILED DESCRIPTION OF THE PREFERRED EMBODIMENTS

Figure 1:
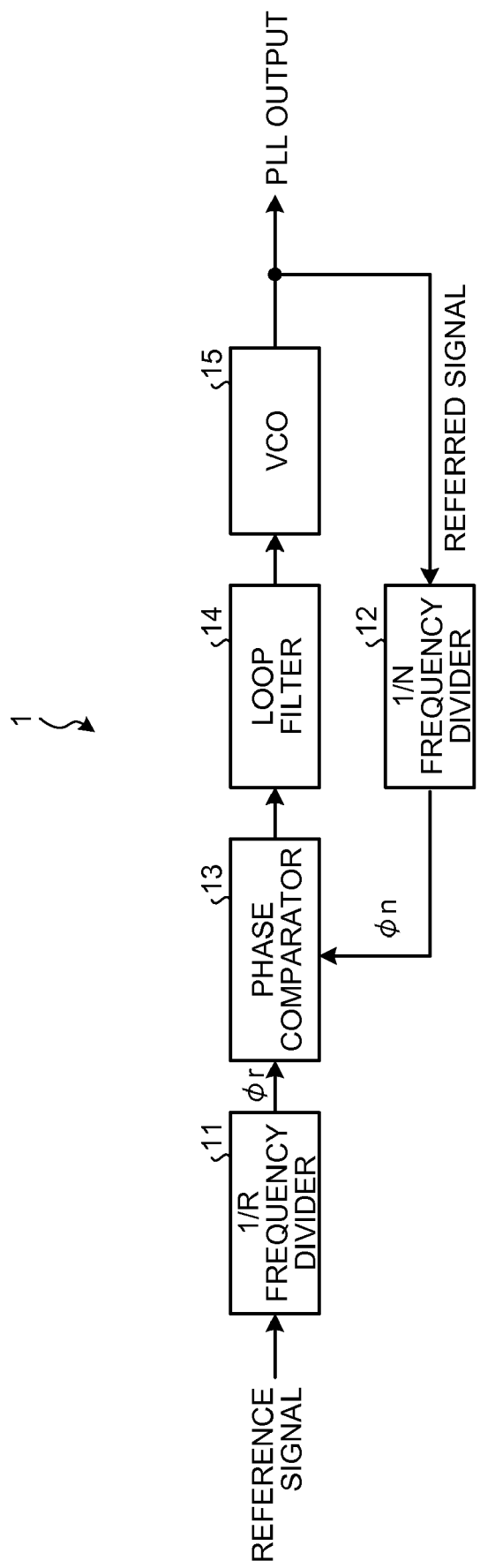
FIG. 1 is a block diagram of a schematic configuration of the inside of a PLL circuit according to a first embodiment.

Based on the drawing, embodiments of the phase comparator, phase synchronizing circuit, and phase-comparison control method according to the present invention are explained in detail below.

First, general outlines of the embodiments are such that, to detect a phase difference between a reference signal and a referred signal based on the reference signal, an input-break detecting unit is incorporated in a phase comparator, the input-break detecting unit detecting an input break of the reference signal when an edge of the referred signal is again detected after an edge of the referred signal is detected and before an edge of the reference signal is detected. As a result, the entire phase synchronizing circuit having the phase comparator implemented therein can be downsized, and cost performance can be increased.

First Embodiment

FIG. 1 is a block diagram of a schematic configuration of the inside of a PLL circuit according to a first embodiment.

A PLL circuit 1 depicted in FIG. 1 includes a 1/R frequency divider 11 that performs R-frequency-division on a reference signal, a 1/N frequency divider 12 that performs N-frequency-division on a referred signal, which is an output signal of the PLL circuit 1, a phase comparator 13 that outputs, based on a phase difference between an R-frequency-divided reference signal φr and an N-frequency-divided referred signal φn, a phase-difference signal for current control so as to decrease the phase difference, a loop filter 14 that outputs a control voltage according to the phase-difference signal, and a voltage control oscillator (VCO) 15 that generates and outputs a referred signal having a desired frequency according to the control voltage.

The PLL circuit 1 outputs a referred signal synchronizing with the reference signal according to the phase-difference signal and having a predetermined desired frequency.

The phase comparator 13 is assumed to adopt a constant-current charge-pump output phase comparator.

Figure 2:
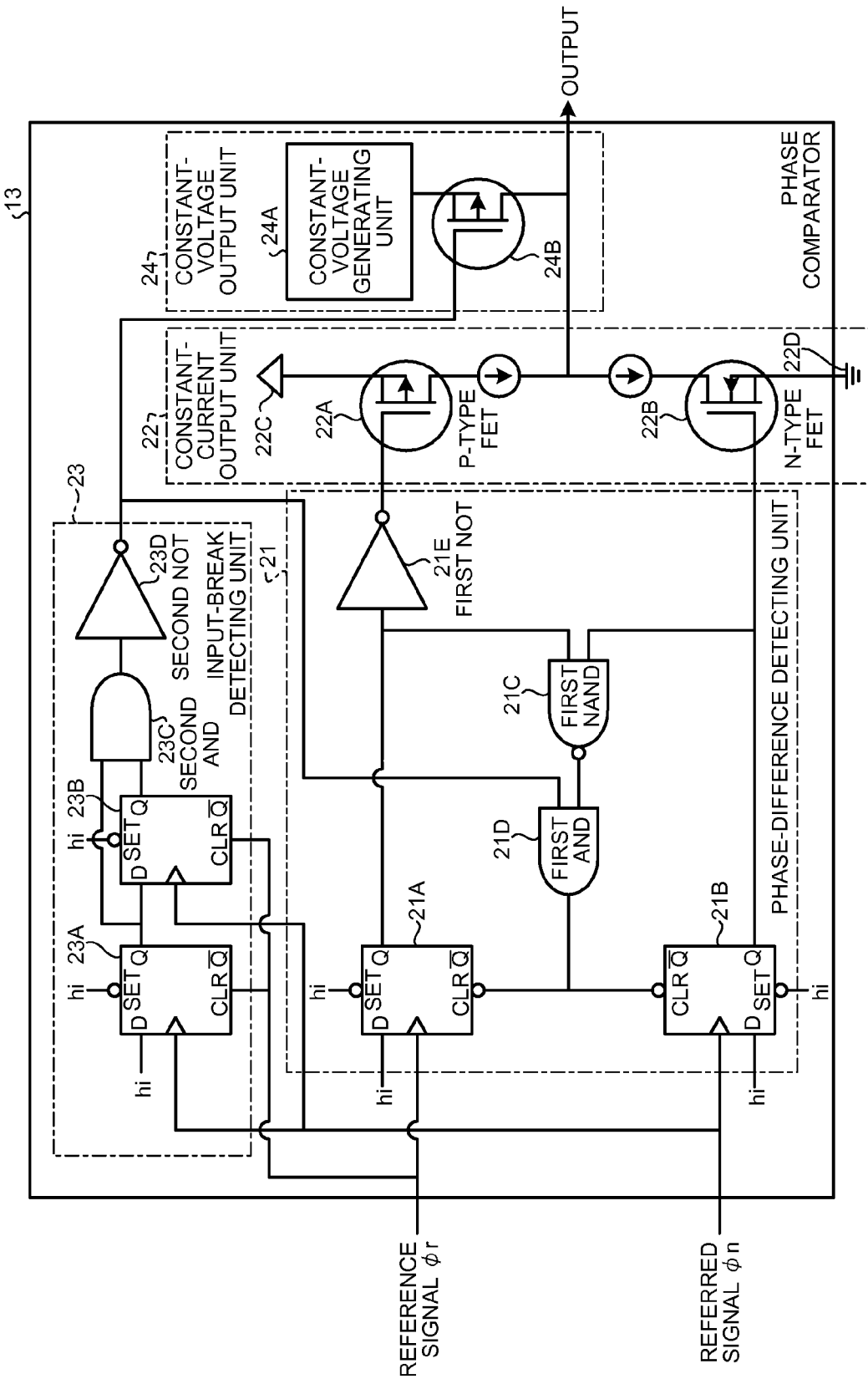
FIG. 2 is a circuit diagram of a schematic configuration of the inside of a phase comparator according to the first embodiment.

FIG. 2 is a circuit diagram of a schematic configuration of the inside of the phase comparator 13 according to the first embodiment.

The phase comparator 13 includes a phase-difference detecting unit 21 that detects a phase difference between the reference signal φr and the referred signal φn, a constant-current output unit 22 that produces a charge-pump output of a phase difference signal for current control based on the detection result of the phase-difference detecting unit 21, an input-break detecting unit 23 that detects an input break of the reference signal φr, and a constant-voltage output unit 24 that outputs a constant voltage in place of a constant-current phase-difference signal from the constant-current output unit 22 when the input-break detecting unit 23 detects an input break of the reference signal φr.

The phase-difference detecting unit 21 includes a D-FF 21A for reference signal that detects a rising edge of the reference signal φr, a D-FF 21B for referred signal that detects a rising edge of the referred signal φn, a first NAND circuit 21C and a first AND circuit 21D that reset the D-FF 21A for reference signal and the D-FF 21B for referred signal, and a first NOT circuit 21E.

The constant-current output unit 22 includes a C-MOS formed of a P-type FET 22A and an N-type FET 22B, a positive-direction current source 22C connected to a source side of the P-type FET 22A, and a negative-direction current source 22D connected to a source side of the N-type FET 22B.

The input-break detecting unit 23 includes a first D-FF 23A that outputs an H level when a rising edge of the referred signal φn is detected, a second D-FF 23B that outputs an H level when the next rising edge following the above-detected rising edge of the referred signal φn is detected, a second AND circuit 23C that determines according to the H level from the first D-FF 23A and the second D-FF 23B outputs an H level that an input break of the reference signal φr is detected and outputs an H level, and a second NOT circuit 23D that outputs an L level according to the H level from the second AND circuit 23C.

The first D-FF 23A and the second D-FF 23B each reset an H-level output according to a rising edge of the reference signal φr.

The constant-voltage output unit 24 includes a constant-voltage generating unit 24A that generates a constant voltage and a P-type FET 24B for voltage output with its source side connected to the constant-voltage generating unit 24A. By brining the drain and source of the FET 24B for voltage output into conductive connection according to the L-level output from the second NOT circuit 23D, the constant-voltage output unit 24 outputs a constant voltage generated at the constant-voltage generating unit 24A to the loop filter 14 through the FET 24B for voltage output. Here, the constant voltage is set at a voltage value self-running at the center frequency of the VCO 15 at the time of an input break of the reference signal φr.

Figure 3:
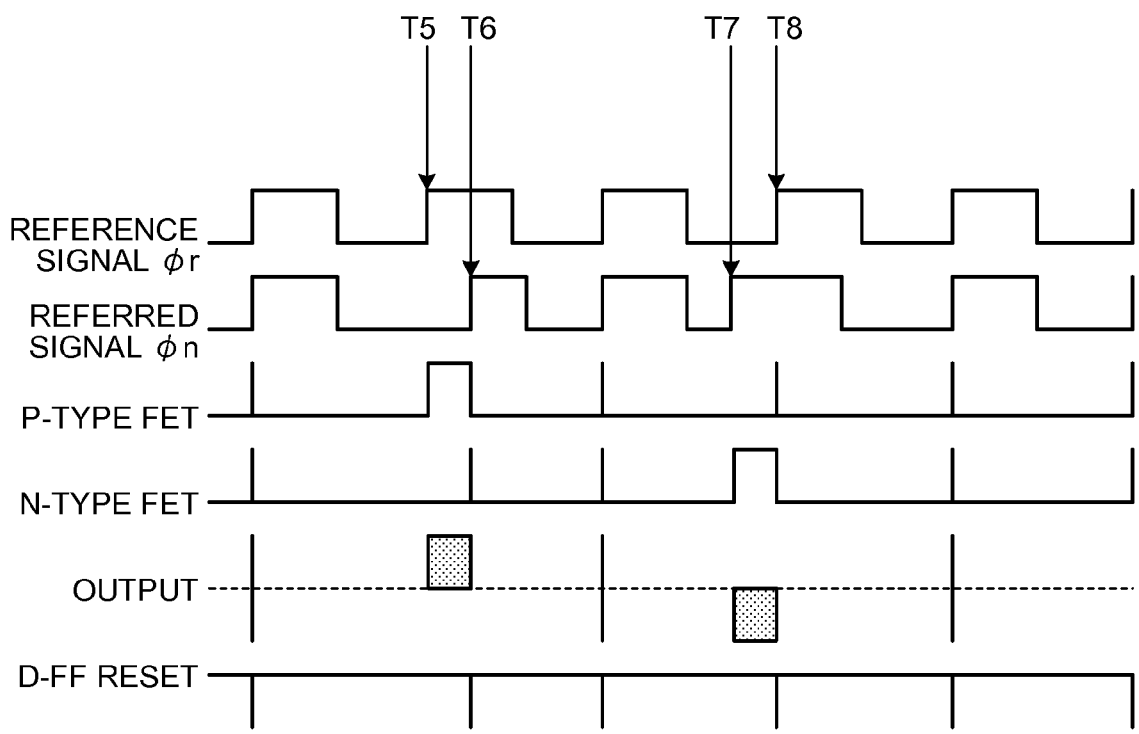
FIG. 3 is a timing chart plainly depicting operation timings of the phase comparator when a reference signal input is normal according to the first embodiment.

Next, the operation of the PLL circuit 1 according to the first embodiment is explained. FIG. 3 is a timing chart plainly depicting operation timings of the phase comparator 13 when a reference signal input is normal according to the first embodiment.

First, the operation of the phase comparator 13 when the referred signal φn lags behind the reference signal φr in phase (refer to a timing T5) is explained.

Upon a clock input of a rising edge of the reference signal φr (refer to the timing T5), the D-FF 21A for reference signal inside of the phase comparator 13 inputs an H level to the first NOT circuit 21E and the first NAND circuit 21C.

According to the H level from the D-FF 21A for reference signal, the first NOT circuit 21E inputs an L level to the P-type FET 22A.

The P-type FET 22A brings the source and drain into conduction according to a gate input at an L level, and outputs to the loop filter 14 a phase-difference signal for current discharge from the positive-direction current source 22C.

As a result, when the referred signal φn lags behind the reference signal φr in phase, the phase comparator 13 causes the constant-current output unit 22 to perform a constant-current discharging operation (constant-current output operation) to discharge a current from the positive-direction current source 22C. With this, a control voltage, which is an output from the loop filter 14, is increased. According to the increase in control voltage, the output phase of the referred signal generated and output from the VCO 15 leads.

Furthermore, upon a clock input of a rising edge of the referred signal φn (refer to a timing T6), the D-FF 21B for referred signal inputs an H level to the first NAND circuit 21C and the N-type FET 22B.

The first NAND circuit 21C inputs an L level to the first AND circuit 21D according to the H level from the D-FF 21A for reference signal and the H level from the D-FF 21B for referred signal.

Also, the first D-FF 23A causes the output to be in a reset state according the rising edge of the reference signal φr, thereby producing a data input of an L level to the second D-FF 23B and inputting an L level to the second AND circuit 23C.

Furthermore, the second D-FF 23B causes the output to be in a reset state according to the rising edge of the reference signal φr, thereby inputting an L level to the second AND circuit 23C.

The second AND circuit 23C determines that an input break of the reference signal φr is not occurring according to the L level from the first D-FF 23A and the L level from the second D-FF 23B, and then inputs an L level to the second NOT circuit 23D.

According to the L level, the second NOT circuit 23D produces a gate input at an H level to the FET 24B for voltage output, and also inputs an H level to the first AND circuit 21D. Here, the FET 24B for voltage output breaks the connection between the source and drain according to the H level from the second NOT circuit 23D, thereby causing a constant-voltage output from the constant-voltage output unit 24 to be in a stop state.

The first AND circuit 21D produces an inverted input of an L level according to the L level from the first NAND circuit 21C and the H level from the second NOT circuit 23D to clear inputs of the D-FF 21A for reference signal and the D-FF 21B for referred signal.

The D-FF 21A for reference signal and the D-FF 21B for referred signal each input an H level to a clear input to reset its output state. Thus, the P-type FET 22A and the N-type FET 22B become in a high-impedance state in which the source and drain are not conducting. As a result, the P-type FET 22A causes the constant-current output unit 22 to stop the constant-current discharging operation (constant-current output operation) to discharge a current from the positive-direction current source 22C.

Next, the operation of the phase comparator 13 when the referred signal φn leads the reference signal φr in phase is explained.

Upon a clock input of a rising edge of the referred signal φn (refer to a timing T7), the D-FF 21B for referred signal inputs an H level to the first NAND circuit 21C and the N-type FET 22B.

According to a gate input at the H level, the N-type FET 22B brings the source and drain into conduction, and outputs a phase-difference signal for taking a current into the negative-direction current source 22D to the loop filter 14. As a result, when the referred signal φn leads the reference signal φr in phase, the phase comparator 13 causes the constant-current output unit 22 to perform a constant-current intake operation (constant-current output operation) to take a current into the negative-direction current source 22D. With this, a control voltage, which is an output from the loop filter 14, is decreased. According to the decrease in control voltage, the output phase of the referred signal generated and output from the VCO 15 lags behind.

Furthermore, upon a clock input of a rising edge of the referred signal φn, the first D-FF 23A inputs an H level to a data input of the second D-FF 23B and the second AND circuit 23C.

Thereafter, upon a clock input of a rising edge of the reference signal φr (refer to a timing T8), the D-FF 21A for reference signal inputs an H level to the first NOT circuit 21E and the first NAND circuit 21C.

The first NAND circuit 21C inputs an L level to the first AND circuit 21D according to the H level from the D-FF 21B for referred signal and the H level from the D-FF 21A for reference signal.

Also, the first D-FF 23A and the second D-FF 23B perform resetting according to the rising edge of the reference signal φr. Upon normal detection of a rising edge of the reference signal φr next to a rising edge of the referred signal φn, the second D-FF 23B inputs an L level to the second AND circuit 23C.

The second AND circuit 23C determines that an input break of the reference signal φr is not present according to the H level from the first D-FF 23A and the L level from the second D-FF 23B, and then inputs an L level to the second NOT circuit 23D.

The second NOT circuit 23D inputs an H level to the FET 24B for voltage output and the first AND circuit 21D according to an L level.

The first AND circuit 21D produces an inverted input of an L level according to the L level from the first NAND circuit 21C and the H level from the second NOT circuit 23D to clear inputs of the D-FF 21A for reference signal and the D-FF 21B for referred signal.

The D-FF 21A for reference signal and the D-FF 21B for referred signal each input an H level to a clear input to reset its output state. Thus, the P-type FET 22A and the N-type FET 22B become in a high-impedance state in which the source and drain are not conducting. As a result, the P-type FET 22A causes the constant-current output unit 22 to stop the constant-current intake operation (constant-current output operation) to take a current into the negative-direction current source 22D.

Next, the operation of the phase comparator 13 when an input break occurs in the reference signal φr is explained.

Figure 4:
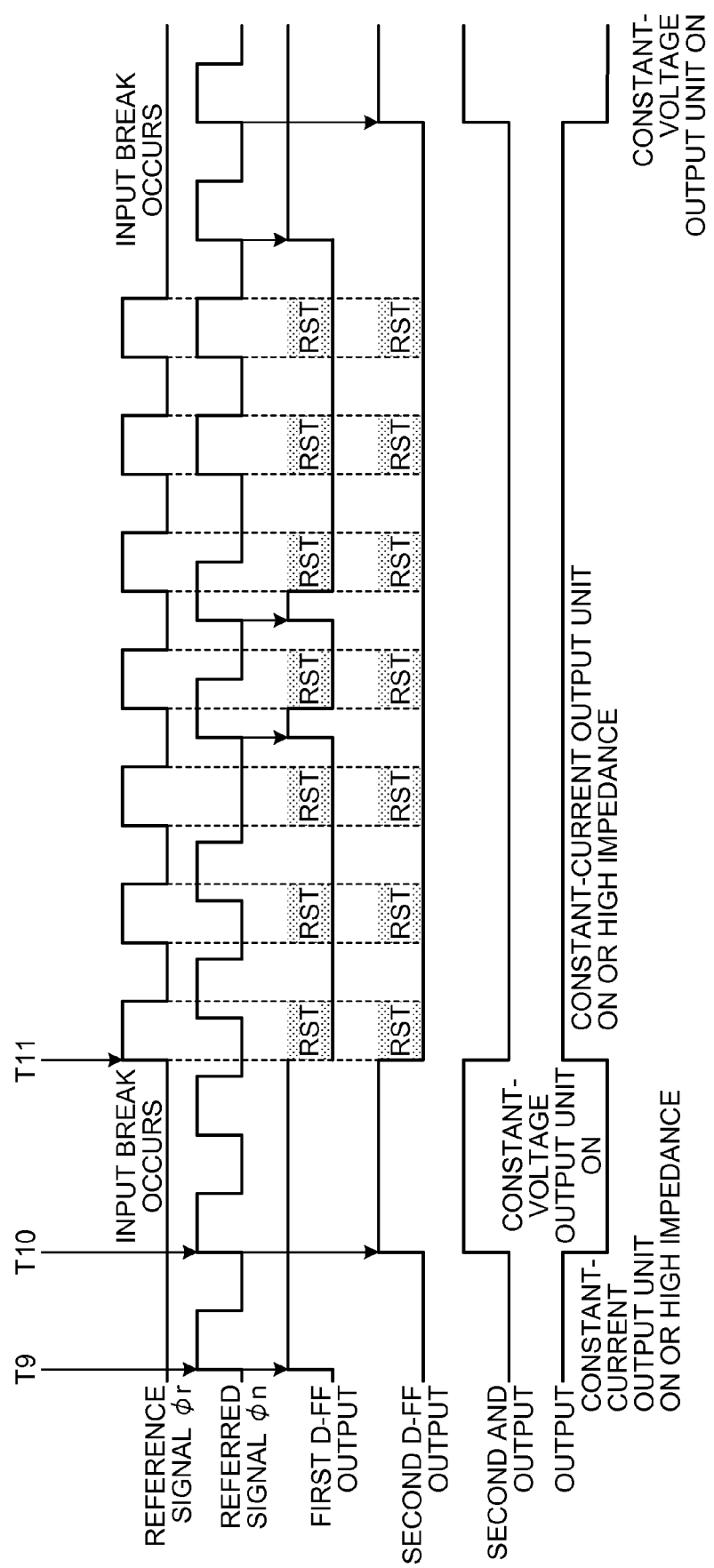
FIG. 4 is a timing chart plainly depicting operation timings of the phase comparator when a reference-signal input break occurs according to the first embodiment.

When an input break occurs in the reference signal φr as depicted in FIG. 4, in the phase comparator 13, after a rising edge of the referred signal φn is detected (refer to a timing T9) and before a rising edge of the reference signal φr is detected, a rising edge of the referred signal φn is again detected (refer to a timing T10).

First, upon a clock input of a rising edge of the referred signal φn (refer to the timing T9), the first D-FF 23A inputs an H level to a data input of the second D-FF 23B and the second AND circuit 23C.

Next, upon a clock input of the next rising edge of the referred signal φn (refer to the timing T10), the second D-FF 23B inputs an H level to the second AND circuit 23C. That is, according to the H level from the first D-FF 23A and the H level from the second D-FF 23B, the second AND circuit 23C determines that a rising edge of the referred signal φn is again detected after a rising edge of the referred signal φn is detected and before a rising edge of the reference signal φr is detected, that is, an input break of the reference signal φr is detected, and inputs an H level to the second NOT circuit 23D.

Also, the first NAND circuit 21C inputs an H level to the first AND circuit 21D according to the H level from the D-FF 21B for referred signal and the L level from the D-FF 21A for reference signal.

Furthermore, the first AND circuit 21D produces an inverted input of an L level to clear inputs of the D-FF 21A for reference signal and the D-FF 21B for referred signal according to the H level from the first NAND circuit 21C and the L level from the second NOT circuit 23D.

The D-FF 21A for reference signal and the D-FF 21B for referred signal each input an H level to a clear input to reset its output state. Thus, the P-type FET 22A and the N-type FET 22B become in a high-impedance state in which the source and drain are not conducting. As a result, the N-type FET 22B causes the constant-current output unit 22 to stop the constant-current intake operation (constant-current output operation) to take a current from the negative-direction current source 22D.

Furthermore, the FET 24B for voltage output brings the source and drain into conductive connection according to the L level from the second NOT circuit 23D, and causes the constant-voltage output unit 24 to voltage-output a constant voltage in place of a phase-difference signal to the loop filter 14, that is, causes the constant-voltage output unit 24 to perform a voltage output operation.

As a result, the FET 24B for voltage output brings the source and drain into conduction according to a gate input at an L level, and adjusts the control voltage of the loop filter 14 according to the constant voltage from the constant-voltage generating unit 24A, thereby adjusting an output phase of the referred signal generated and output from the VCO 15.

Next, the operation when an input of a reference signal φr is recovered after an input break of the reference signal φr occurs is explained.

After an input break of the reference signal φr occurs, the first D-FF 23A detects a rising edge of the reference signal φr (refer to a timing T11). Upon a clear input of the rising edge of the reference signal φr, the first D-FF 23A resets its output state, thereby inputting an L level to a data input of the second D-FF 23B and the second AND circuit 23C.

Also, upon a clear input of the rising edge of the reference signal φr, the second D-FF 23B resets its output state, thereby inputting an L level to the second AND circuit 23C.

The second AND circuit 23C determines that the input of the reference signal φr has been recovered according to the L level from the first D-FF 23A and the second D-FF 23B, thereby inputting an L level to the second NOT circuit 23D.

The second NOT circuit 23D inputs an H level according to the L level to the FET 24B for voltage output and the first AND circuit 21D.

The FET 24B for voltage output breaks the connection between the source and drain according to the H level from the second NOT circuit 23D. With this, the phase comparator 13 makes a transition from a constant-voltage output operation of the constant-voltage output unit 24 to a high-impedance state allowing a normal constant-current output operation of the constant-current output unit 22.

The first AND circuit 21D produces an inverted input of an L level to clear inputs of the D-FF 21A for reference signal and the D-FF 21B for referred signal according to the H level from the second NOT circuit 23D and the L level from the first NAND circuit 21C.

The D-FF 21A for reference signal and the D-FF 21B for referred signal each input an H level to a clear input to reset its output state. Thus, the P-type FET 22A and the N-type FET 22B become in a high-impedance state in which the source and drain are not conducting.

According to the first embodiment, the input-break detecting unit 23 is incorporated in the phase comparator 13 which detects an input break of the reference signal φr when an edge of the referred signal φn is again detected after an edge of the referred signal φn is detected and before an edge of the reference signal φr is detected. Therefore, the entire PLL circuit 1 having the phase comparator 13 implemented therein can be downsized, and cost performance can be increased.

Also, according to the first embodiment, upon detection of an input break of the reference signal φr, an output of the phase-difference signal based on the phase difference is stopped, that is, a constant-current output operation of the constant-current output unit 22 is stopped. And an output of a constant voltage from the constant-voltage generating unit 24A taking the center value of the control voltage of the VCO 15 is started, that is, a constant-voltage output operation of the constant-voltage output unit 24 is started. According to the constant-voltage output operation, the PLL circuit 1 can be subjected to self-running control.

Furthermore, according to the first embodiment, after an input break of the reference signal φr is detected, when a rising edger of the reference signal φr is detected, the constant-voltage output operation of the constant-voltage output unit 24 is stopped, and then a transition is made to a high-impedance state allowing a restart of a constant-current output operation of the constant-current output unit 22. Thus, when an input of the reference signal φr is recovered, a phase difference between the reference signal and the referred signal can be eliminated through a normal constant-current output operation.

Still further, according to the first embodiment, the phase comparator includes the first D-FF 23A that outputs an H level according to a clock input of a rising edge of the referred signal φn and causes a reset state according to a rising edge of the reference signal φr and a second D-FF 23B that outputs an H level according to a clock input of the next rising edge following the rising edge of the referred signal φn and causes a reset state according to a rising edge of the reference signal φr. According to the H level from the first D-FF 23A and the H level from the second D-FF 23B, an input break of the reference signal φr is detected. With this, the input-break detecting unit 23 can be configured with simple circuitry.

Here, in the first embodiment, the constant-voltage generating unit 24A is incorporated inside of the phase comparator 13. According to the L level from the second NOT circuit 23D, the connection between the drain and source of the FET 24B for voltage output is made conductive. Through the FET 24B for voltage output, a constant voltage from the constant-voltage generating unit 24A is voltage-output to the loop filter 14. Alternatively, the constant-voltage generating unit may be disposed outside of the phase comparator 13, and an arbitrary voltage value may be voltage-output as a constant-voltage value according to user settings to achieve similar effects.

Still further, in the first embodiment, the constant-voltage generating unit 24A is incorporated inside of the phase comparator 13. According to the L level from the second NOT circuit 23D, the connection between the drain and source of the FET 24B for voltage output is made conductive. Through the FET 24B for voltage output, a constant voltage from the constant-voltage generating unit 24A is voltage-output to the loop filter 14. Alternatively, the following configuration is possible, which is now explained below as a second embodiment.

Second Embodiment

Figure 5:
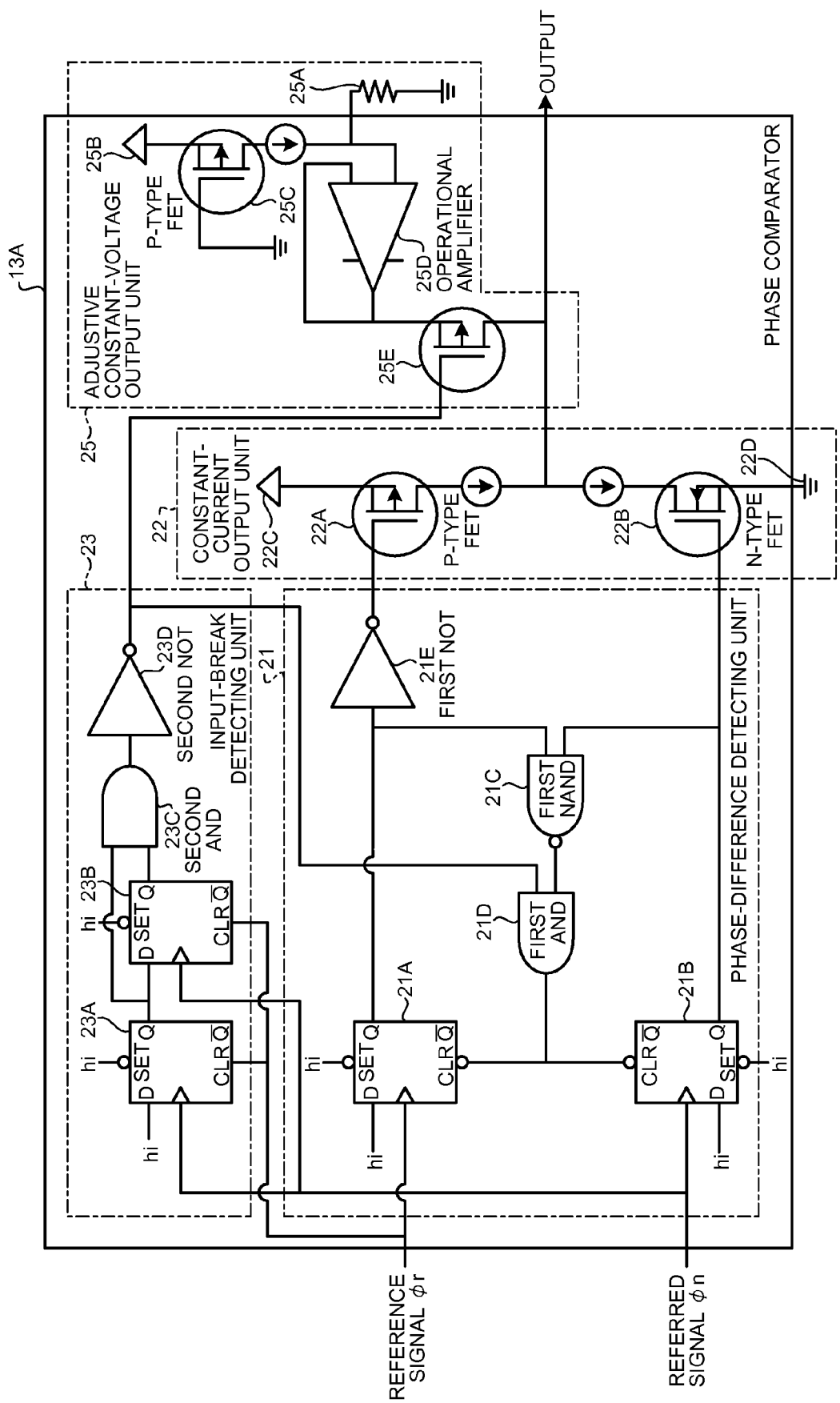
FIG. 5 is a circuit diagram of a schematic configuration of the inside of a phase comparator according to a second embodiment.
Figure 6:
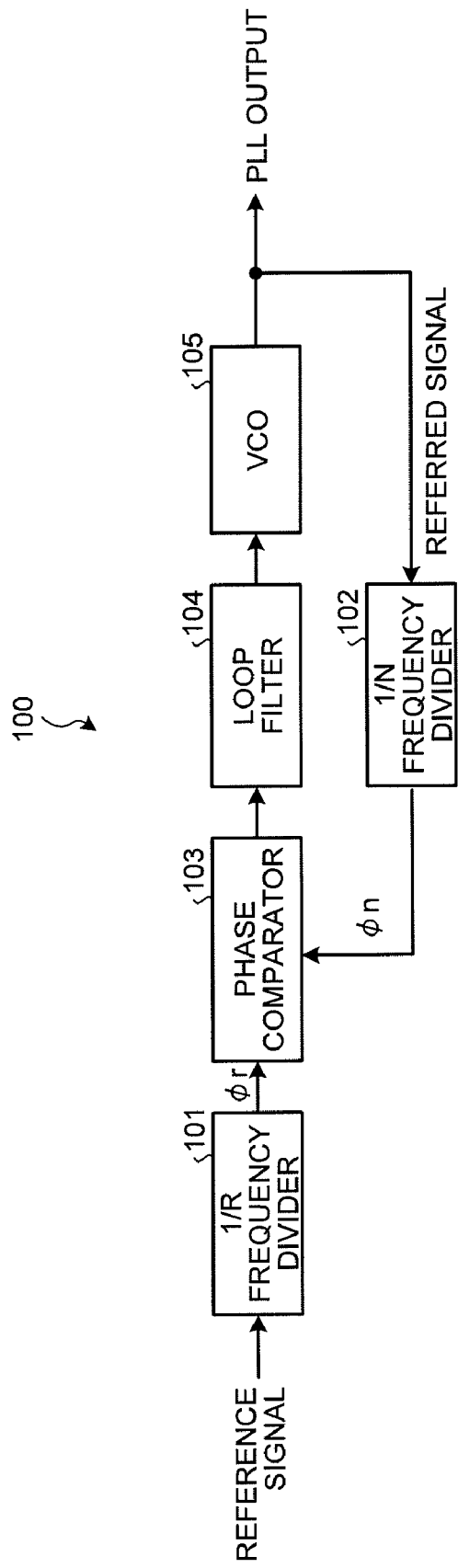
FIG. 6 is a block diagram of a schematic configuration of the inside of a PLL circuit in a conventional technology.
Figure 7:
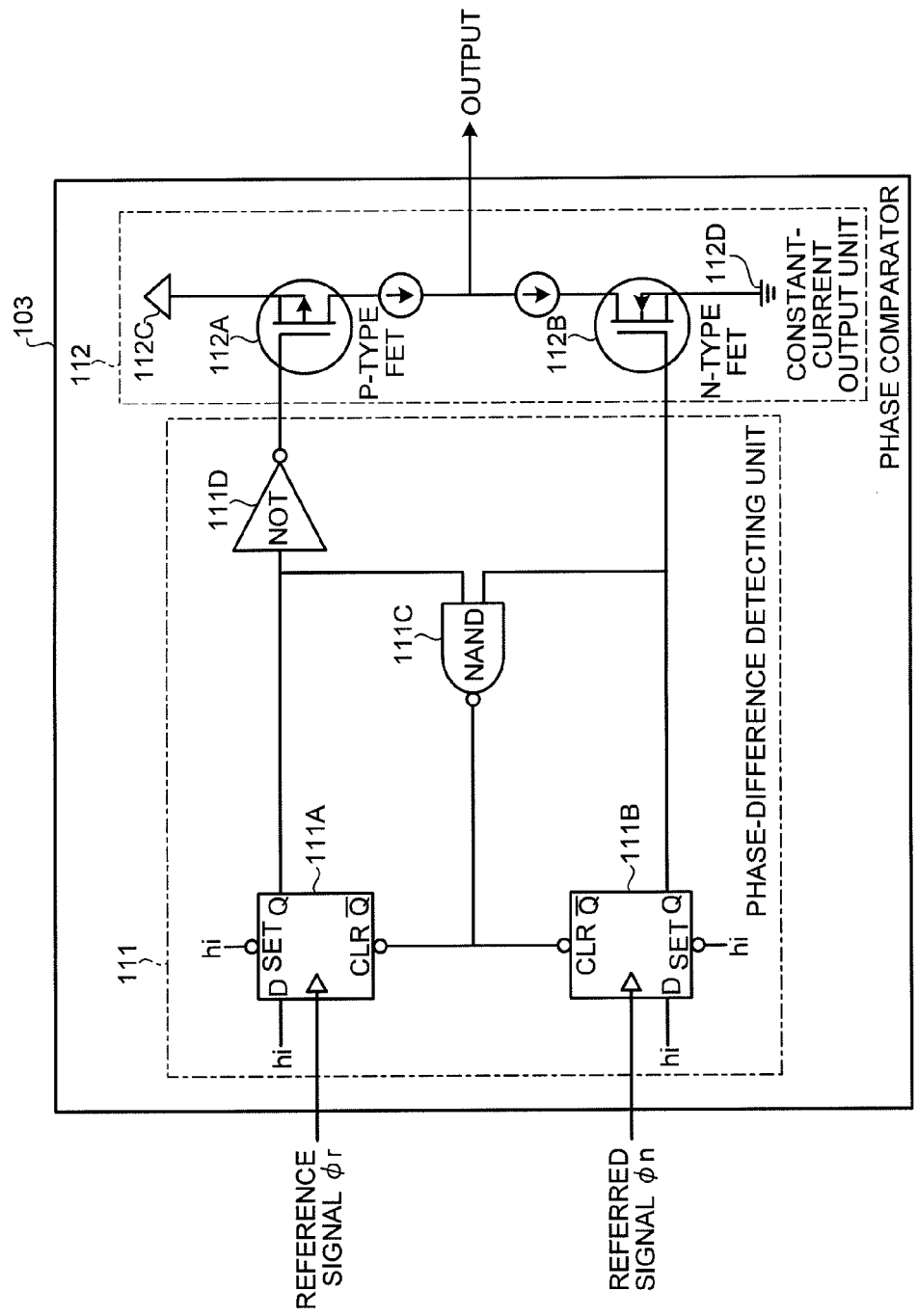
FIG. 7 is a circuit diagram of a schematic configuration of the inside of a phase comparator according to the conventional technology.
Figure 8:
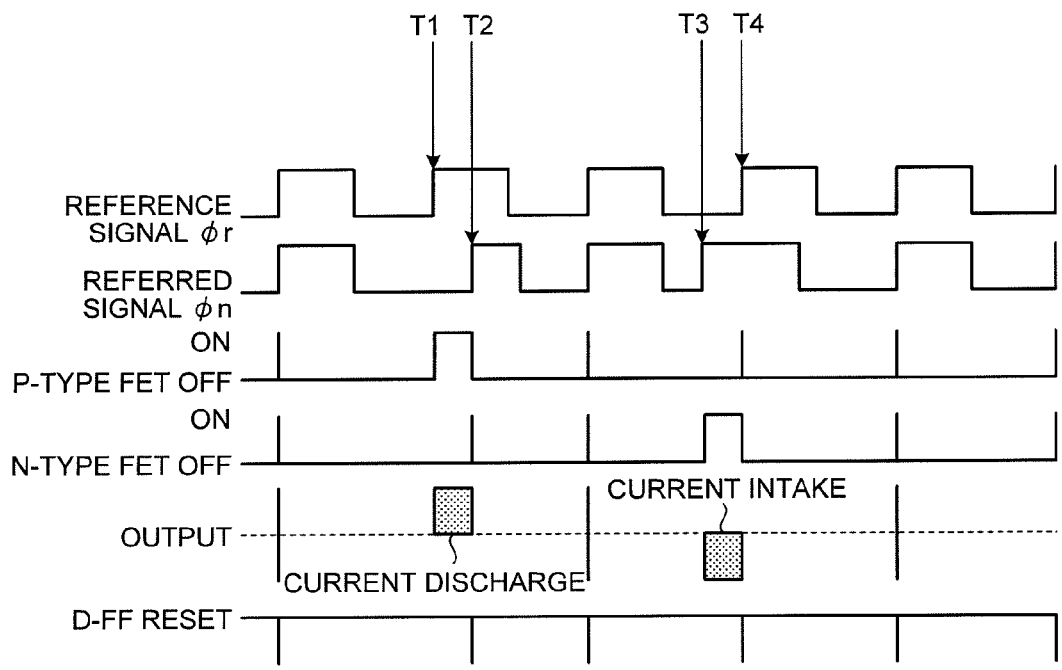
FIG. 8 is a timing chart plainly depicting operation timings of the phase comparator when a reference signal input is normal according to the conventional technology.
Figure 9:
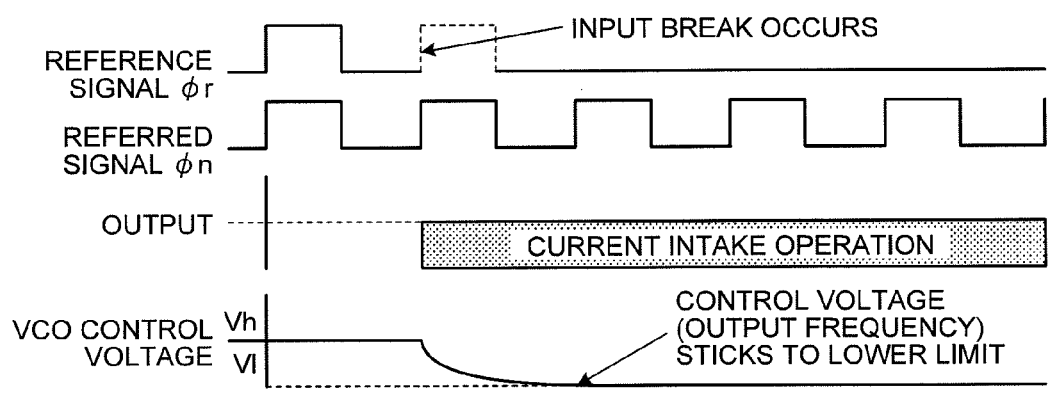
FIG. 9 is a timing chart plainly depicting operation timings of the phase comparator when a reference-signal input break occurs according to the conventional technology.

FIG. 5 is a circuit diagram of a schematic configuration of the inside of a phase comparator 13A according to the second embodiment. Here, components identical to those of the phase comparator 13 in the first embodiment are provided with the same reference numerals, and these redundant components and operations are not explained herein.

The phase comparator 13A depicted in FIG. 5 is different from the phase comparator 13 depicted in FIG. 2 in that an adjustive constant-voltage output unit 25 is provided in place of the constant-voltage output unit 24. The adjustive constant-voltage output unit 25 can adjust a constant voltage value to be output to the loop filter 14 when an input break of the reference signal φr is detected by the input-break detecting unit 23.

The adjustive constant-voltage output unit 25 includes a resistor for constant-voltage setting 25A disposed outside of the phase comparator 13A, a constant-current source 25B, and a P-type FET 25C having a source side connected to the constant-current source 25B and a drain side connected to the resistor for constant-voltage setting 25A.

The adjustive constant-voltage output unit 25 further includes an operational amplifier 25D that is connected to the drain side of the P-type FET 25C and converts a constant-current value from the constant-current source 25B to a constant-voltage value and an FET 25E for voltage output that has a source side connected to the operational amplifier 25D and voltage-outputs to the loop filter 14 the constant-voltage value obtained through conversion by the operational amplifier 25D.

Here, by adjusting the resistor for constant-voltage setting 25A, the constant-voltage value output from the FET 25E for voltage output can be set at an arbitrary constant-voltage value for adjusting the center frequency of the VCO 15 via the loop filter 14.

According to the second embodiment, it is not only possible to incorporate the input-break detecting unit 23 that detects an input break of the reference signal φr inside of the phase comparator 13A but also possible to set an arbitrary constant-voltage value according to volume adjustment of the resistor for constant-voltage setting 25A.

While the embodiments of the present invention have been explained, it goes without saying that these embodiments are not meant to restrict the range of the technical idea of the present invention and other various embodiments can be implemented as long as they do not deviate from the range of the technical idea in the claims. Also, the effects in the embodiments are not meant to be restrictive.

Among the processes explained in the embodiments above, it goes without saying that all or part of the processes explained as being automatically performed may be manually performed, and all or part of the processes explained as being manually performed may be automatically performed. It also goes without saying that the process procedure, the control procedure, specific names, and information including various data and parameters can be changed as appropriate unless otherwise specified.

Furthermore, each component depicted is conceptual in function, and is not necessarily physically configured as depicted. Specific patterns of the components are not meant to be restricted to those depicted in the drawings.

Still further, it goes without saying that all or arbitrary part of various process functions performed in each component may be achieved on a Central Processing Unit (CPU) (or a microcomputer, such as Micro Processing Unit (MPU) or Micro Controller Unit (MCU)), on a program analyzed and executed on that CPU (or microcomputer, such as MPU or MCU), or on hardware with a wired logic.

According to the disclosed device, an input-break detecting unit is incorporated which detects an input break of the input reference signal when an edge of the referred signal is again detected after an edge of the referred signal is detected and before an edge of the reference signal is detected. Therefore, an effect can be achieved such that, for example, the entire phase synchronizing circuit having a phase comparator implemented therein can be downsized and cost performance can be increased.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A phase comparator comprising:
an edge detecting unit to which a reference signal is input and to which a referred signal based on the reference signal is input as a feedback signal, the edge detecting unit detecting an edge of the reference signal and an edge of the referred signal;
a phase-difference detecting unit that detects a phase difference between the edge of the reference signal and the edge of the referred signal detected by the edge detecting unit;
an input-break detecting unit that detects an input break of the reference signal when an edge of the referred signal is again detected after an edge of the referred signal is detected and before an edge of the reference signal is detected;
a predetermined-voltage output unit that outputs a predetermined voltage; and
a phase-difference-signal output unit that outputs a phase-difference signal for current control based on the phase difference detected by the phase-difference detecting unit so that the phase difference between the reference signal and the referred signal is decreased, the phase-difference-signal output unit,
when an input break of the reference signal is detected by the input-break detecting unit, stopping outputting the phase-difference signal based on the phase difference detected by the phase-difference detecting unit, and outputting as the phase-difference signal the predetermined voltage output from the predetermined-voltage output unit to a loop filter that outputs a control voltage according to the phase-difference signal.

2. The phase comparator according to claim 1, wherein after the input break of the reference signal is detected by the input-break detecting unit, when an edge of the reference signal is detected by the edge detecting unit, the phase-difference-signal output unit stops outputting the predetermined voltage as the phase-difference signal, and restarts outputting the phase-difference signal based on the phase difference detected by the phase-difference detecting unit.

3. The phase comparator according to claim 1, wherein the edge detecting unit detects a rising edge of the reference signal and a rising edge of the referred signal.

4. The phase comparator according to claim 1, wherein the phase-difference-signal output unit performs current control as a phase-difference signal based on the phase difference detected by the phase-difference detecting unit.

5. A phase comparator comprising:
an edge detecting unit to which a reference signal is input and to which a referred signal based on the reference signal is input as a feedback signal, the edge detecting unit detecting an edge of the reference signal and an edge of the referred signal;
a phase-difference detecting unit that detects a phase difference between the edge of the reference signal and the edge of the referred signal detected by the edge detecting unit;
a phase-difference-signal output unit that outputs a phase-difference signal for current control based on the phase difference detected by the phase-difference detecting unit so that the phase difference between the reference signal and the referred signal is decreased; and
an input-break detecting unit that detects an input break of the reference signal when an edge of the referred signal is again detected after an edge of the referred signal is detected and before an edge of the reference signal is detected, the input-break detecting unit including
a first flip-flop circuit that outputs a first output signal according to a clock input of a rising edge of the referred signal, and resets the first output signal according to a rising edge of the reference signal,
a second flip-flop circuit that outputs a second output signal according to a clock input of a next rising edge following the rising edge of the referred signal, and resets the second output signal according to the rising edge of the reference signal, and
an AND circuit that carries out an AND operation of the first output signal from the first flip-flop circuit and the second output signal from the second flop-flop circuit.

6. A phase synchronizing circuit comprising:
a phase comparing unit to which a reference signal is input and to which a referred signal based on the reference signal is input as a feedback signal, the phase comparing unit outputting a phase-difference signal for current control based on a phase difference between the input reference signal and the referred signal so that the phase difference between the reference signal and the referred signal is decreased, the phase comparing unit including
an edge detecting unit to detects an edge of the reference signal and an edge of the referred signal,
a phase-difference detecting unit that detects a phase difference between the edge of the reference signal and the edge of the referred signal detected by the edge detecting unit,
an input-break detecting unit that detects an input break of the reference signal when an edge of the referred signal is again detected after an edge of the referred signal is detected and before an edge of the reference signal is detected,
a predetermined-voltage output unit that outputs a predetermined voltage, and
a phase-difference-signal output unit that outputs a phase-difference signal for current control based on the phase difference detected by the phase-difference detecting unit so that the phase difference between the reference signal and the referred signal is decreased, the phase-difference-signal output unit,
when an input break of the reference signal is detected by the input-break detecting unit, stopping outputting the phase-difference signal based on the phase difference detected by the phase-difference detecting unit, and outputting the predetermined voltage output from the predetermined-voltage output unit as the phase-difference signal to a loop filter that outputs a control voltage according to the phase-difference signal;
a control-voltage generating unit that outputs the control voltage according to the phase-difference signal from the phase comparing unit; and
a voltage-control oscillating unit that generates and outputs a referred signal having a desired frequency according to the control voltage generated by the control-voltage generating unit.

7. The phase synchronizing circuit according to claim 6, wherein
after the input break of the reference signal is detected by the input-break detecting unit, when an edge of the reference signal is detected by the edge detecting unit, the phase-difference-signal output unit stops outputting the predetermined voltage as the phase-difference signal, and restarts outputting the phase-difference signal based on the phase difference detected by the phase-difference detecting unit.

8. The phase synchronizing circuit according to claim 6, wherein
the edge detecting unit detects a rising edge of the reference signal and a rising edge of the referred signal.

9. The phase synchronizing circuit according to claim 6, wherein
the phase-difference-signal output unit performs current control as a phase-difference signal based on the phase difference detected by the phase-difference detecting unit.

10. A phase synchronizing circuit comprising:
a phase comparing unit to which a reference signal is input and to which a referred signal based on the reference signal is input as a feedback signal, the phase comparing unit outputting a phase-difference signal for current control based on a phase difference between the input reference signal and the referred signal so that the phase difference between the reference signal and the referred signal is decreased, the phase comparing unit including
an edge detecting unit that detects an edge of the reference signal and an edge of the referred signal,
a phase-difference detecting unit that detects a phase difference between the edge of the reference signal and the edge of the referred signal detected by the edge detecting unit,
a phase-difference-signal output unit that outputs a phase-difference signal for current control based on the phase difference detected by the phase-difference detecting unit so that the phase difference between the reference signal and the referred signal is decreased, and
an input-break detecting unit that detects an input break of the reference signal when an edge of the referred signal is again detected after an edge of the referred signal is detected and before an edge of the reference signal is detected, the input-break detecting unit including a first flip-flop circuit that outputs a first output signal according to a clock input of a rising edge of the referred signal, and resets the first output signal according to a rising edge of the reference signal, a second flip-flop circuit that outputs a second output signal according to a clock input of a next rising edge following the rising edge of the referred signal, and resets the second output signal according to the rising edge of the reference signal, and an AND circuit that carries out an AND operation of the first output signal from the first flip-flop circuit and the second output signal from the second flop-flop circuit;

a control-voltage generating unit that outputs a control voltage according to the phase-difference signal from the phase comparing unit; and a voltage-control oscillating unit that generates and outputs a referred signal having a desired frequency according to the control voltage generated by the control-voltage generating unit.

11. A phase-comparison control method of a phase comparator comprising:

detecting an edge of an input reference signal and an edge of a referred signal input as a feedback signal based on the reference signal;

detecting a phase difference between the detected edge of the reference signal and the detected edge of the referred signal;

outputting a phase-difference signal for current control based on the detected phase difference so that the phase difference between the reference signal and the referred signal is decreased;

detecting an input break of the reference signal when an edge of the referred signal is again detected after an edge of the referred signal is detected and before an edge of the reference signal is detected; and stopping outputting the phase-difference signal based on the detected phase difference, and outputting a predetermined voltage as the phase-difference signal to a loop filter that outputs a control voltage according to the phase-difference signal.

12. The phase-comparison control method according to claim 11, further comprising stopping outputting the predetermined voltage as the phase-difference signal, and restarting outputting the phase-difference signal based on the detected phase difference, when an edge of the reference signal is detected after the input break of the reference signal is detected.

13. The phase-comparison control method according to claim 11, wherein the detecting the edge includes detecting a rising edge of the reference signal and a rising edge of the referred signal.

14. The phase-comparison control method according to claim 11, wherein the outputting the phase-difference-signal includes performing current control as a phase-difference signal based on the detected phase difference.

15. A phase-comparison control method of a phase comparator comprising:

detecting an edge of an input reference signal and an edge of a referred signal input as a feedback signal based on the reference signal;

detecting a phase difference between the detected edge of the reference signal and the detected edge of the referred signal;

outputting a phase-difference signal for current control based on the detected phase difference so that the phase difference between the reference signal and the referred signal is decreased; and detecting an input break of the reference signal when an edge of the referred signal is again detected after an edge of the referred signal is detected and before an edge of the reference signal is detected, the detecting the input-break including outputting a first output signal according to a clock input of a rising edge of the referred signal;

outputting a second output signal according to a clock input of a next rising edge following the rising edge of the referred signal;

carrying out an AND operation of the first output signal and the second output signal;

resetting the first output signal according to a rising edge of the reference signal; and resetting the second output signal according to the rising edge of the reference signal.

* * * * *